(12) United States Patent
Vallett

(10) Patent No.: US 6,452,209 B2
(45) Date of Patent: Sep. 17, 2002

(54) SEMICONDUCTOR DEVICES HAVING BACKSIDE PROBING CAPABILITY

(75) Inventor: David P. Vallett, Fairfax, VT (US)

(73) Assignee: International Business Machines Corporation, Armonk, NY (US)

( * ) Notice: Subject to any disclaimer, the term of this patent is extended or adjusted under 35 U.S.C. 154(b) by 109 days.

(21) Appl. No.: 09/771,778

(22) Filed: Jan. 29, 2001

Related U.S. Application Data

(62) Division of application No. 09/501,920, filed on Feb. 10, 2000, which is a continuation of application No. 09/010,881, filed on Jan. 22, 1998, now Pat. No. 6,078,057, which is a division of application No. 08/806,570, filed on Feb. 25, 1997, now Pat. No. 5,990,562.

(51) Int. Cl.$^7$ .............................................. H01L 23/58
(52) U.S. Cl. ........................................ 257/48; 257/621
(58) Field of Search ..................... 257/48, 621; 438/11, 438/14, 15, 18

(56) References Cited

U.S. PATENT DOCUMENTS

| | | |
|---|---|---|
| 4,573,008 A | 2/1986 | Lischke |
| 4,688,063 A | 8/1987 | Lu et al. |
| 4,751,458 A | 6/1988 | Elward, Jr. |
| 4,873,205 A | 10/1989 | Critchlow et al. |
| 4,888,087 A | 12/1989 | Moslehi et al. |
| 4,924,589 A | 5/1990 | Leedy |
| 4,983,544 A | 1/1991 | Lu et al. |
| 4,983,908 A | 1/1991 | Tada et al. |
| 5,210,599 A | 5/1993 | Kawai |
| 5,270,261 A | 12/1993 | Bertin et al. |
| 5,316,978 A | 5/1994 | Boyd et al. |
| 5,321,304 A | 6/1994 | Rostoker |
| 5,444,021 A | 8/1995 | Chung et al. |
| 5,481,205 A | 1/1996 | Frye et al. |
| 5,821,549 A | 10/1998 | Talbot et al. |
| 5,990,562 A | 11/1999 | Vallett |
| 6,078,057 A * | 6/2000 | Vallett ............... 148/DIG. 122 |

* cited by examiner

Primary Examiner—Steven Loke
Assistant Examiner—Thien F. Tran
(74) Attorney, Agent, or Firm—Schmeiser, Olsen & Watts; Howard J. Walter, Jr.

(57) ABSTRACT

Integrated circuits are provided which permit backside probing while being operated. Conductive trenches are fabricated into the surface of semiconductor chip at preselected locations. Access to specific electrically connected nodes of the integrated circuit can be effected through the conductive trenches by backside thinning and milling of the semiconductor chip followed by e-beam probe or mechanical probe usage.

2 Claims, 2 Drawing Sheets

SEMICONDUCTOR DEVICES HAVING BACKSIDE PROBING CAPABILITY

This application is a divisional of Ser. No. 09/501,920, filed on Feb. 10, 2000, which is a continuation of 09/010,881 filed Jan. 22, 1998, now U.S. Pat. No. 6,078.057, issued on Jun. 20, 2000, which is a divisional of 08/806,570 filed Feb. 25, 1997, now U.S. Pat. No. 5,990,562, issued on Nov. 23, 1999.

BACKGROUND OF THE INVENTION

1. Technical Field

The present invention relates to integrated circuit devices having improved backside probing capability. More particularly, the present invention relates to the use of deep trenches which have been critically fabricated with respect to degree of depth and location to facilitate characterization, diagnostic testing, and potential defect detection during development, manufacture, and usage. The conductive portions of the trenches can be accessed by conventional electrical probing methods after the backside of the semiconductor chip has been subjected to standard polishing techniques, followed by milling with focused ion beam, laser-assisted etch techniques, or chemical etching.

2. Background Art

In the manufacture of semiconductor devices, the ability to obtain waveform measurements from internal nodes has been found to be critical to carryout failure analysis and characterization. Often active surfaces of the semiconductor devices are obscured by I/O(input/output) circuits, interconnect wiring, packaging, or limitations of the probing apparatus.

During the integrated circuit development phase, early engineering hardware is often characterized by subjecting the device to various test conditions such as speed, temperature, etc. Measuring and diagnosing the performance of these devices is done by acquiring waveforms from key circuit nodes within the device such as clock lines, enable signals, address buses, and data buses. If the early engineering hardware does not perform adequately, or is non-functional, it is critical to be able to trace back signals to the source of the problem. A convenient mode of detecting such failure source is by waveform analysis. The ability to diagnose problems by waveform analysis is also necessary during manufacture and throughout the life of the product so that corrective action can be taken.

Those skilled in the art know that waveforms can be acquired from internal circuit nodes by direct-contact mechanical probing or electron-beam probing. Additional techniques such as laser-induced light also have been reported. In order to prepare a device for diagnosis, it is necessary to establish electrical contact with a tester and one or more of the numerous Input/Output (I/O) circuits in the device. In some instances, these I/O circuits are placed in the periphery of the device, or located in a manner to provide some degree of access to the device's active surface by some form of mechanical or electron beam probe during operation. However, as a result of increasing circuit complexity, a trend toward higher density packaging, or the density of the I/O circuits and related probes needed to activate the device, improvments in semiconductor device structures to provide enhanced means for mechanical or electron beam probe are needed.

To facilitate electrical access to the I/O of the IC, additional circuits and pads are frequently positioned adjacent to, or on the upper-most level of the IC die. Quite frequently, such IC dies with I/O circuit elements situated on the top surface have the disadvantage of obstructing internal circuitry. Additionally, packaging methods, often referred to as a "flip-chip", "C4", or direct chip attach (DCA), can be attached upside-down, or flipped onto a package substrate, or directly onto a circuit board, flexible cable, or other assembly into which the IC is interconnected. As a result, the internal circuit nodes of the IC are buried and inaccessible for characterizing electrical circuit performance, performing diagnostic testing, or performing failure analysis while the IC is operating normally and in a fully functioning state.

A procedure for monitoring the fabrication of a semiconductor device using an electrical characteristic such as resistance is shown by Rostoker, U.S. Pat. No. 5,321,304. A semiconductor wafer is provided having vias through the wafer, and a contact structure at the top to provide a conductive path through the wafer. An insulating layer overlies the contact structure to signal the endpoint of chem-mech polishing. Lu et al, U.S. Pat. No. 4,688,063, incorporated herein by reference, shows the feasibility of introducing a storage capacitor in a semiconductor device in the form of a trench capacitor which is used as part of a Dynamic Random Access Memory (DRAM) cell. The trench capacitors are positioned from the surface of semiconductor device to a heavily doped region within the cell. A DRAM cell is shown which uses a field effect transistor (FET) and a trench capacitor which forms a well in the semiconductor substrate. An electrode disposed in the trench capacitor is directly connected to the source drain of the access transistor.

While exterior conductive contact structures connected to vias extending through a semiconductor wafer have been used to facilitate the polishing of such wafer, or trench capacitors have been disposed in a semiconductor substrate as part of a DRAM cell, nothing is shown by the art to satisfy the need for enhanced characterization, diagnosis, or failure analysis capability in semiconductor devices through mechanical or electron beam probe techniques, particularly from the backside of the die.

SUMMARY OF THE INVENTION

It is an aspect of the present invention therefore to provide a system for obtaining access to internal circuit nodes of fully processed and packaged integrated circuits (IC's) for the purpose of making electrical measurements to facilitate electrical characterization, diagnostic testing, and failure analysis.

It is another aspect of the present invention to provide test points which can be incorporated into the design of an IC without adversly affecting the operation of the device.

It is a further aspect of the present invention to provide internal IC test points which can be readily accessed for electrical characterization, diagnostic testing, and failure analysis.

It is an additional aspect of the present invention to provide a method for accessing internal test points through the back or reverse-side of an IC in a non-invasive manner.

Accordingly, the present invention is directed to the use of trenches in a semiconductor device which have been fabricated in preselected locations. The trenches are filled with a conductive material and are electrically connected to particular circuit nodes of the semiconductor device to provide readily accessible test points which are also suitable for backside electrical probing. Unlike a trench capacitor normally used as a memory cell in a semiconductor device, trenches used in the integrated circuit devices of the present invention are insulated on the sidewall to the extent that their performance as capacitors is substantially precluded.

There is provided by the present invention, an integrated circuit comprising a plurality of interconnected circuits, each having a plurality of internal circuit nodes, and at least one circuit node accessing means including an insulated electrical conductor extending from a surface of the integrated circuit to a point substantially below the surface and positioned to facilitate non-invasive electrical probing of at least one preselected circuit node via the backside of the substrate.

BRIEF DESCRIPTION OF THE DRAWINGS

Other features and advantages of the invention will become apparent from the following description when taken in conjunction with the accompanying drawings in which.

DETAILED DESCRIPTION OF THE INVENTION

Figure 1:
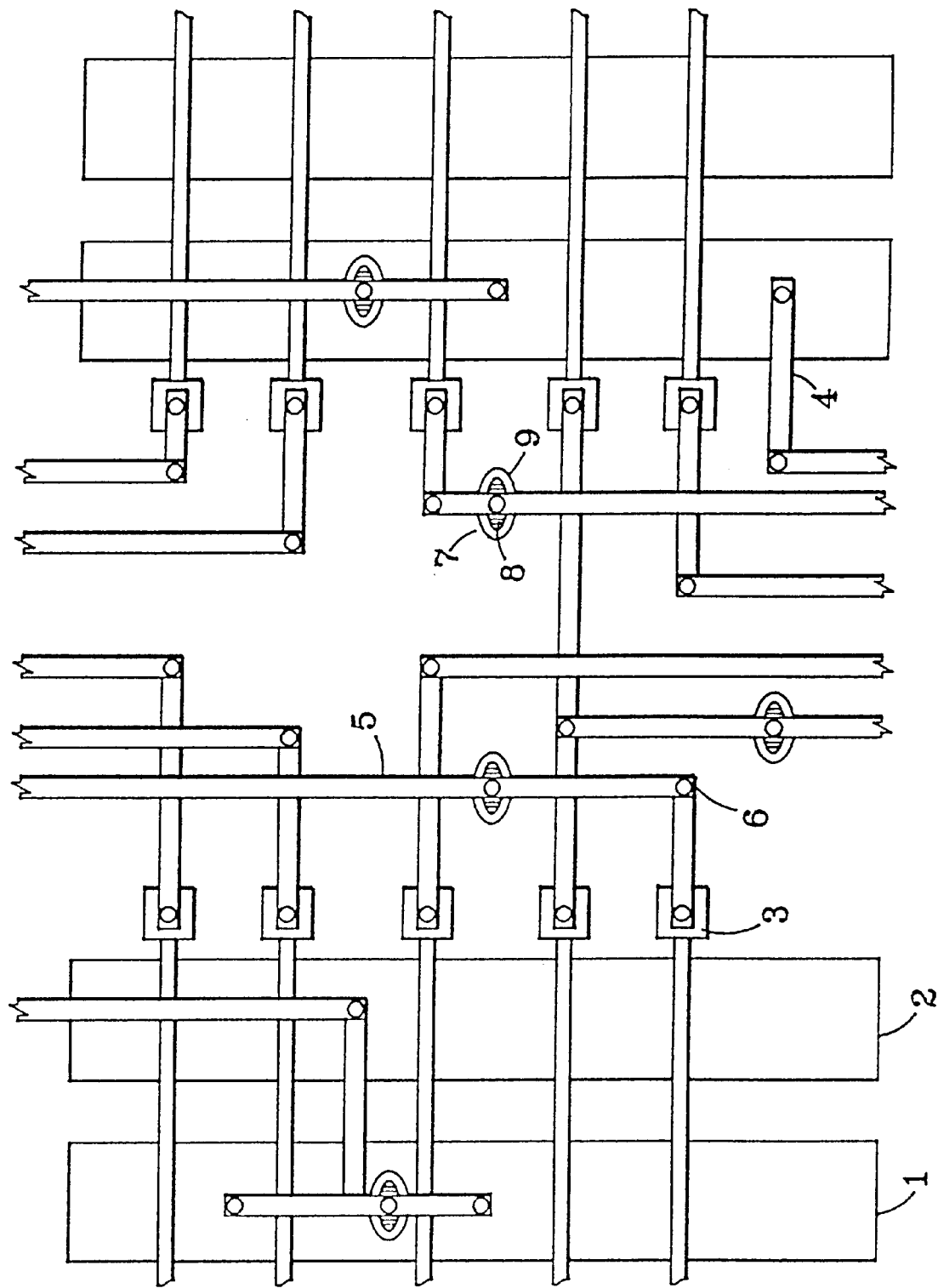
FIG. 1 is a plan view of a preferred embodiment of the present invention showing the placement of buried test points in a typical IC layout.

FIG. 1, more particularly shows a top view portion of a typical IC layout. For example, gate elements shown at 3 are over source/drain areas shown at 1 and 2, and interconnected with a first level of wiring at 4 and a second level of wiring 5. Additional levels of wiring (not shown) are common and included as needed. Inter-level contacts or vias at 6 provide vertical connections between the various elements.

There is further shown in FIG. 1, the location of a particular test point at 7, consisting of a conductive material at 8, and an insulating layer at 9. Overall, this IC layout can be placed on a semiconductor substrate such as silicon having a thickness of several hundred microns.

Figure 2:
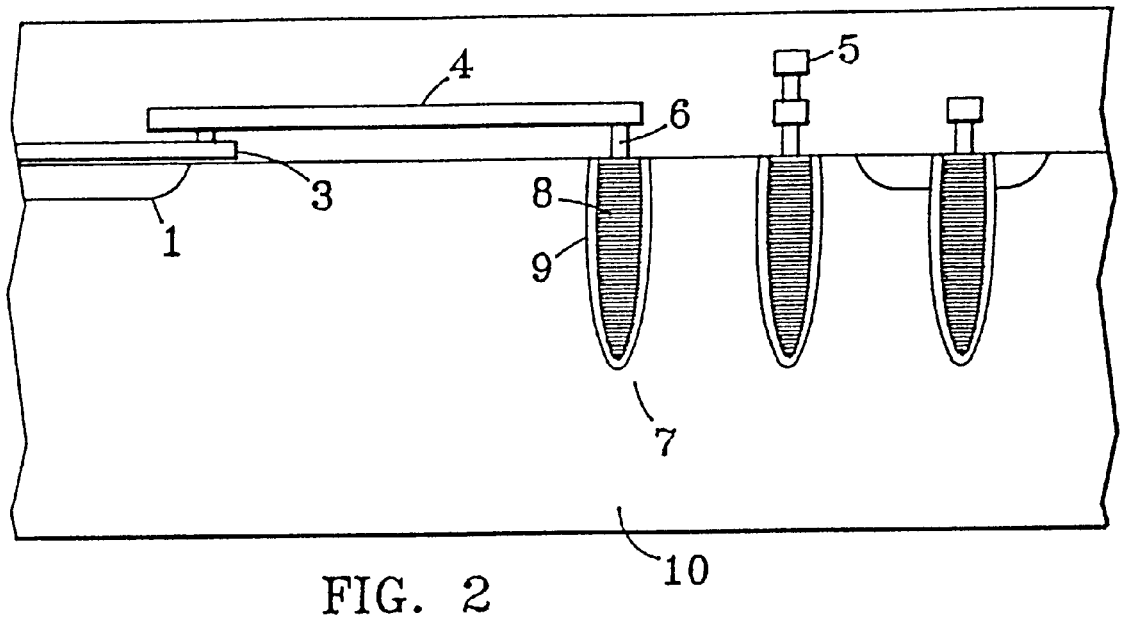
FIG. 2 is a cross-sectional view of a preferred embodiment of the invention showing the buried test points and their connection to overlying circuit elements.

With reference to FIG. 2, three test points, more specifically illustrated by 7, are shown. The test points are filled trenches that extend into substrate 10. They are composed of a conductive inner material shown by 8 and an insulating outer layer shown by 9. The conductive inner material 8 is electrically connected to the circuit elements of interest, such as wiring levels 4 or 5. The insulating outer layer 9 neutralizes any test points, for example, 7. Insulating outer layer 9 also minimizes the capacitance between the various circuit elements, 1, 2, 3, 4, and 5, and substrate 10.

Test points shown in FIG. 2, are constructed using technology well known in the semiconductor field. In the manufacture of deep trenches for isolation, or as storage capacitors for dynamic random access memory (DRAM) cells, deep trenches can be formed in a silicon substrate using reactive ion etch (RIE). An oxide layer can then be grown on the sidewalls of the trench to form an insulating layer. The resulting cavity is then filled with an appropriate material, for example, polycrystalline silicon which is highly doped with phosphorous to prevent depletion effects outside the trench depending on whether it is to be used for isolation, or as a storage capacitor. In instances where the trench is used as a storage capacitor for making DRAM's, as described for example in U.S. Pat. No. 4,688,063 to Lu et al, it is usually necessary to increase its density, while minimizing its surface area. In addition to the surface area of the trench, other factors for influencing its capacitance are the dielectric constant and thickness of the insulating material 9. Values of 40 to 100 femtofarads of capacitance are typical, with cell areas of 20 to 40 square microns, and insulator thicknesses of about 15 nanometers, using silicon-dioxide, silicon-nitride, or combinations thereof. Trenches of 3 to 10 microns deep are also typical.

While capacitance values in the afordescribed femtofarad range will have no detrimental effects on the logic signals found on most IC devices, in particular situations, such as operating at higher frequencies, it may be desirable to modify the filled trenches. In such instances, capacitance can be minimized by using a thicker insulating layer. This can be accomplished by growing a thicker layer during the oxidation step of the trench process. The use of a thicker insulating layer is also desirable to counteract the increased capacitance that may arise from the use of a larger or deeper trench. Thicknesses on the order of 150 to 250 nanometers or more would be appropriate, depending on the corresponding surface area. Trench depths of 8–12 micrometers are sufficient in order to ensure that the test points extend significantly below any active circuit areas and are more accessible.

Figure 3:
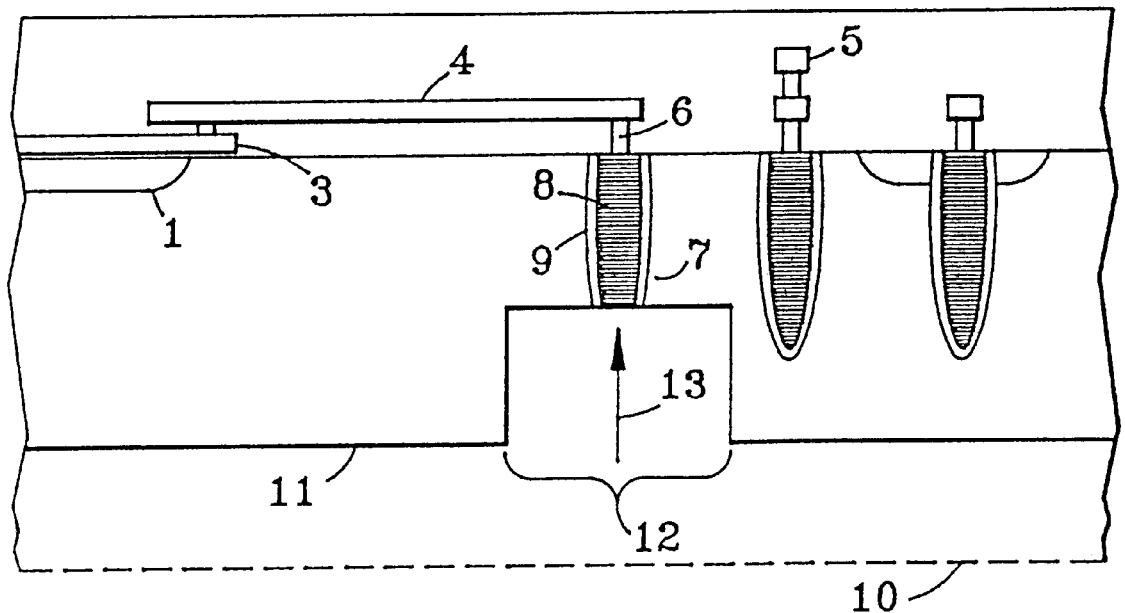
FIG. 3 is a cross-sectional view of a preferred embodiment of the invention showing how the buried test points may be accessed from the back-side of the IC.

A two step process can be used to gain access to the test points without disturbing the operation of the IC. The first step is thinning the entire semiconductor substrate and the second is drilling, milling, or etching holes to specific test points or groups of test points. Referring to FIG. 3, a cross-section of a circuit and associated test points are shown. The original back surface of a semiconductor substrate 10 has been thinned several hundred microns by mechanical, chemical, or chemical-mechanical polishing techniques to surface 11. This enables the use of focused ion beam (FIB), laser-assisted micro-machining, or chemical etching to form a hole 12 from the polished back surface of the IC die to the tip of the desired test point or group of test points. The desired test point or group of test points is located using reflected infrared microscopy from the back surface of the IC die alone or in combination with CAD navigation software and a motorized stage to precisely position the desired test point in the focused ion beam (FIB) or laser-assisted micro-machining tool. A small portion of the insulating material at 9 is also removed thereby exposing the conductive fill material at 8 to be probed at 13 using either a contact-mode with a conductive tip, or a non-contact mode with an electron-beam.

Probing techniques are often not feasible while the IC is in operation, since the internal IC circuit nodes may be obscured by the input/output (I/O) interconnect structures, packaging material, or probe apparatus used to interface with the IC. However, in view of the advantages provided by the present invention, once the desired test point, or group of test points is exposed, it may be accessed to carry out various procedures with electron-beam or mechanical probing, such as electrical characterization, diagnostic testing, and failure analysis.

What is claimed is:

1. An integrated circuit having a plurality of circuits, said integrated circuit capable of receiving a backside probe in order to facilitate failure analysis of the integrated circuit while it is in an active or an inactive state, said integrated circuit comprising:

trenches patterned in a predetermined manner in the integrated circuit surface to allow electrical connection between selected node points of the integrated circuit, said trenches having an insulating layer on the sidewalls of the trenches with a thickness sufficient to minimize trench capacitance, and filled with a conductive material;

each trench extending partially through a substrate to a depth sufficient to permit ready access by non-invasive probing from the backside of such surface, after using at least one standard overall substrate thinning technique;

at least one test point to which a site-specific accessing technique is applied;

and further wherein the backside of the integrated circuit has been thinned sufficiently to permit the probing of at least one preselected circuit node.

2. An integrated circuit having a plurality of circuits, said integrated circuit capable of receiving backside probing means in order to facilitate failure analysis of the integrated circuit while it is in an active or an inactive state, said integrated circuit comprising:

trenches patterned in a predetermined manner in the integrated circuit surface to allow electrical connection between selected node points of the integrated circuit said trenches having an insulating layer on the sidewalls of the trenches with a thickness sufficient to minimize trench capacitance, and filled with a conductive material;

each trench extending partially through a substrate to a depth sufficient to permit ready access by non-invasive probing from the backside of such surface, after using at least one standard overall substrate thinning technique;

at least one test point to which a site-specific accessing technique is applied;

and wherein the backside of the integrated circuit can be accessed by e-beam or mechanical probing after backside probe points have been exposed.

* * * * *